United States Patent
Tempel

(10) Patent No.: US 7,642,544 B2
(45) Date of Patent: Jan. 5, 2010

(54) PRODUCTION METHOD FOR SEMICONDUCTOR COMPONENT WITH STRESS-CARRYING SEMICONDUCTOR LAYER

(75) Inventor: Georg Tempel, München (DE)

(73) Assignee: Infineon Technologies AG, Munich (DE)

( * ) Notice: Subject to any disclaimer, the term of this patent is extended or adjusted under 35 U.S.C. 154(b) by 261 days.

(21) Appl. No.: 10/521,498

(22) PCT Filed: Jul. 11, 2003

(86) PCT No.: PCT/DE03/02352

§ 371 (c)(1),
(2), (4) Date: Aug. 29, 2005

(87) PCT Pub. No.: WO2004/010485

PCT Pub. Date: Jan. 29, 2004

(65) Prior Publication Data

US 2006/0118867 A1    Jun. 8, 2006

(30) Foreign Application Priority Data

Jul. 15, 2002    (DE) ................. 102 31 964

(51) Int. Cl.
H01L 21/20    (2006.01)
(52) U.S. Cl. ................................. 257/21.125
(58) Field of Classification Search .......... 257/E21.125
See application file for complete search history.

(56) References Cited

U.S. PATENT DOCUMENTS 5,232,862 A    8/1993    Heremans et al.
5,569,538 A    10/1996    Cho
5,810,924 A    9/1998    Legoues et al.
6,475,857 B1 *  11/2002    Kim et al. .................. 438/240

FOREIGN PATENT DOCUMENTS

EP    11233440    8/1999
EP    1 120 818 A1    8/2001

OTHER PUBLICATIONS

Tsutomu Tezuka, Naoharu Sugiyama, Tomohisa Mizuno and Shin-ichi Takagi "High Performance Strained Si-on-Insulator MOSFETs by Novel Fabrication Processes Utilizing Ge-Condensation Technique" 2002 Symposium on VLSI Technology Digest of Technical Papers, pp. 96-97.

(Continued)

Primary Examiner—Howard Weiss
(74) Attorney, Agent, or Firm—Brinks Hofer Gilson & Lione

(57) ABSTRACT

The invention relates to a semiconductor component with stress-absorbing semiconductor layer (SA) and an associated fabrication method, a crystalline stress generator layer (SG) for generating a mechanical stress being formed on a carrier material (1). An insulating stress transmission layer (2), which transmits the mechanical stress which has been generated to a stress-absorbing semiconductor layer (SA), is formed at the surface of the stress generator layer (SG), with the result that in addition to improved charge carrier mobility, improved electrical properties of the semiconductor component are also obtained.

20 Claims, 2 Drawing Sheets

OTHER PUBLICATIONS

T. Tezuka, N. Sugiyama, S. Takagi "Fabrication of a Strained is on sub-10-nm-thick SiGe-on-insulator virtual substrate" Materials and Science Engineering B89, 2002, pp. 360-363.

D.L. Harame, J.H. Comfort, J.D. Cressler, E.F. Crabbé, J.Y.-C Sun, B.S. Meyerson, T. Tice "Si/SiGe Epitaxial-Base Transistors-Part II: Process Integration and Analog Applications" IEEE Transactions on Electron Devices, vol. 42, No. 3, Mar. 1995, pp. 469-482.

H. Zogg "Strain Relief in Epitaxial Flouride Buffer Layers for Semiconductor Heteroepitaxy" Applied Physics Letters, No. 15, Oct. 13, 1986, pp. 933-935.

* cited by examiner

PRODUCTION METHOD FOR SEMICONDUCTOR COMPONENT WITH STRESS-CARRYING SEMICONDUCTOR LAYER

This application is entering the nationalization stage from PCT Application No. PCT/DE03/002352 under § 35 U.S.C. 371(c) filed on Jul. 11, 2003, designating the U.S., and claiming priority under 35 U.S.C. § 365(a)-(c) to German Patent Application 102 31 964.2 filed in Germany on Jul. 15, 2002, both of which are incorporated herein by reference.

The present invention relates to a semiconductor component with stress-absorbing semiconductor layer, and to an associated fabrication method, and in particular to a sub-100 nanometer field-effect transistor with fully depleted active region.

As the development of semiconductor components continues, ever smaller feature sizes are desired with a view to improving the integration density. However, certain limits are being reached on account of limited charge carrier mobility in semiconductor materials. Since an upper limit to the charge carrier mobility of electrons and holes in a semiconductor crystal is dependent on the physical properties of the semiconductor crystal, the required charge carrier mobility cannot be established or cannot be established with sufficient accuracy in the case of very small feature sizes of a semiconductor component. Furthermore, what are known as high-k gate dielectrics (dielectrics with a high dielectric constant), which are also required for the increasing integration density, cause a reduced charge carrier mobility.

Therefore, what are known as semiconductor components with stress-absorbing semiconductor layers (strained semiconductors) have been developed, making it possible to improve charge carrier mobility in a stress-absorbing semiconductor crystal.

FIG. 1 shows a simplified illustration of a crystal demonstrating this effect. It is usual for a stress-absorbing or mechanically loaded Si layer as stress-absorbing semiconductor layer SA to be formed by growing a thin crystal layer on a carrier crystal, the lattice constant of which is different than the lattice constant of the silicon crystal which has been grown on. It is customary for an SiGe crystal layer to be used as the so-called stress generator layer SG, in which case the Ge content can be adjusted and is preferably approx. 20%. This results in a lattice constant for the SiGe crystal SG which is approx. 0.8% greater than the lattice constant of the Si layer SA deposited thereon. These different lattice constants result, in particular for the stress-absorbing Si layer SA, in the mechanical stresses which are represented by the arrows, with the result that ultimately it is possible to establish a better charge carrier mobility on account of the piezoresistance effect in this layer.

To achieve improved insulation properties and thereby a reduced leakage current as well as reduced capacitances in a semiconductor circuit, it is customary to use what are known as SOI (silicon on insulator) substrates, but the technology described above cannot be applied directly to SOI substrates of this nature.

FIG. 2 shows a simplified sectional view through an SiGe-on-insulator nMOSFET, as is known, for example, from the literature reference T. Tezuka et al.: "Novel Fully-Depleted SiGe-On-Insulator pMOSFETs with High-Mobility SiGe Surface Channels" IEEE 2001. In this case, an amorphous $SiO_2$ layer 200 is formed on an Si carrier substrate 100, resulting in a typical SOI substrate. Then, a stress generator layer SG, which in its lower region includes a crystalline Si layer with an SiGe layer subsequently grown on it in order to generate the mechanical stress, is formed at the surface of the $SiO_2$ layer 200. Then, an Si layer is grown on as stress-absorbing semiconductor layer SA, which on account of the different lattice constants is under a mechanical stress and therefore has an increased charge carrier mobility. Finally, a gate oxide layer 300 and a polysilicon layer 400 are formed as control layer, source and drain regions S and D being formed for connection of the stress-absorbing semiconductor layer SA which forms a channel region K. However, with a conventional semiconductor component with stress-absorbing semiconductor layer SA of this type, it is impossible to further reduce the feature sizes, in particular in a sub-100 nm range, or to further improve the electrical properties.

Therefore, the invention is based on the object of providing a semiconductor component having a stress-absorbing semiconductor layer and an associated fabrication method which has improved electrical properties even in a sub-100 nm range.

In particular by using a crystalline stress generator layer formed on a carrier material and an insulating stress transmission layer formed thereon, it is possible for the stresses which are generated and transmitted to be absorbed in a stress-absorbing semiconductor layer formed thereon to such an extent that on the one hand an improved charge carrier mobility is established and on the other hand improved electrical properties can be achieved in the semiconductor component.

It is preferable for the stress-absorbing semiconductor layer to include an intrinsic semiconductor, the thickness of which is less than ⅓ of a length of the channel region, resulting in a semiconductor component with a fully depleted semiconductor body. In addition to the improved charge carrier mobility, this also results in a reduced off-current with a simple structure.

It is preferable for the stress transmission layer to have a lattice constant which is matched to the second lattice constant of the stress-absorbing semiconductor layer, resulting in excellent transmission properties for the mechanical load or stress.

Furthermore, in this way it is for the first time possible to use gate dielectrics with a high dielectric constant and control layers with a metal gate in semiconductor components with stress-absorbing layers, with the result that an equivalent oxide thickness (EOT) for the gate dielectric can be reduced and excellent gate driving properties can be achieved.

To achieve an excellent starting surface, it is preferable for an Si substrate with a (100) surface orientation and a Si buffer layer deposited thereon to be used as carrier material.

Furthermore, to improve a surface quality, it is also possible for the stress generator layer to be smoothed by means of a molecular beam epitaxy process, resulting in further improved electrical properties for the semiconductor component.

It is preferable for Si to be used as carrier material, for SiGe to be used as stress generator layer, for $CaF_2$ to be used as stress transmission layer, for Si to be used as stress-absorbing semiconductor layer, for $HfO_2$ to be used as gate dielectric and for TiN to be used as control layer, with the result that, using standard material, a particularly simple structure and excellent properties in particular with regard to the off-current, the charge carrier mobility, the equivalent oxide thickness, etc. are obtained.

Further advantageous configurations of the invention are characterized in the subclaims.

The invention is described in more detail below on the basis of an exemplary embodiment and with reference to the drawing, in which.

The invention is described below by way of example on the basis of an nMOSFET as semiconductor component with stress-absorbing semiconductor layer. However, it is not restricted to this application and in the same way also encompasses pMOSFETs and other corresponding semiconductor components which have a stress-absorbing semiconductor layer for the purpose of improving charge carrier mobility.

Figure 1:
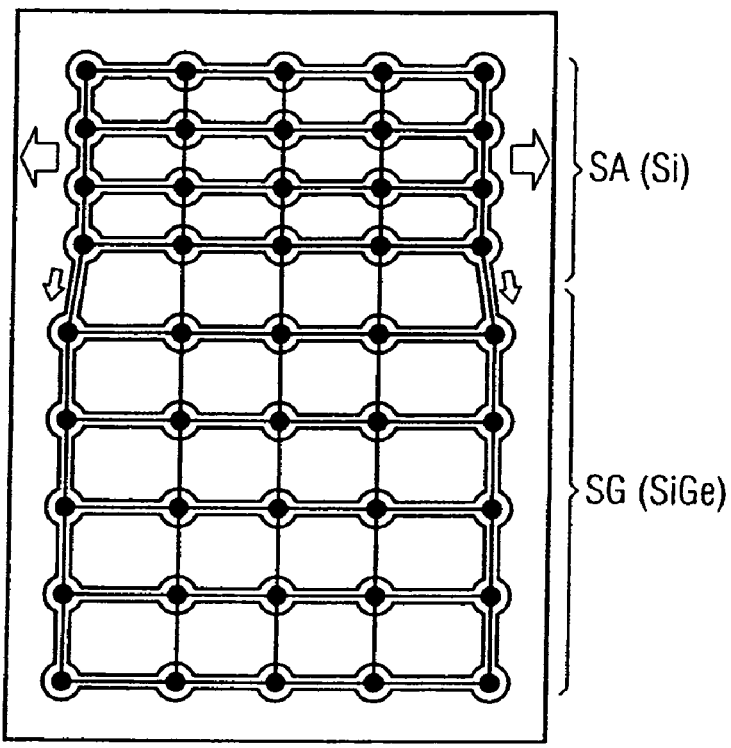
FIG. 1 shows a simplified illustration of a crystal showing significant effects in stress-absorbing semiconductor layers.
Figure 2:
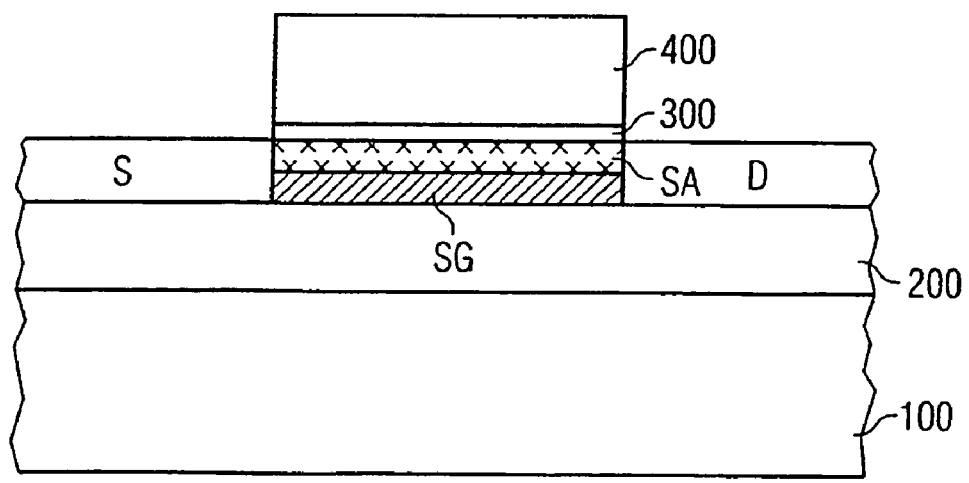
FIG. 2 shows a simplified sectional view through a conventional semiconductor component with stress-absorbing semiconductor layer.
Figure 3A:
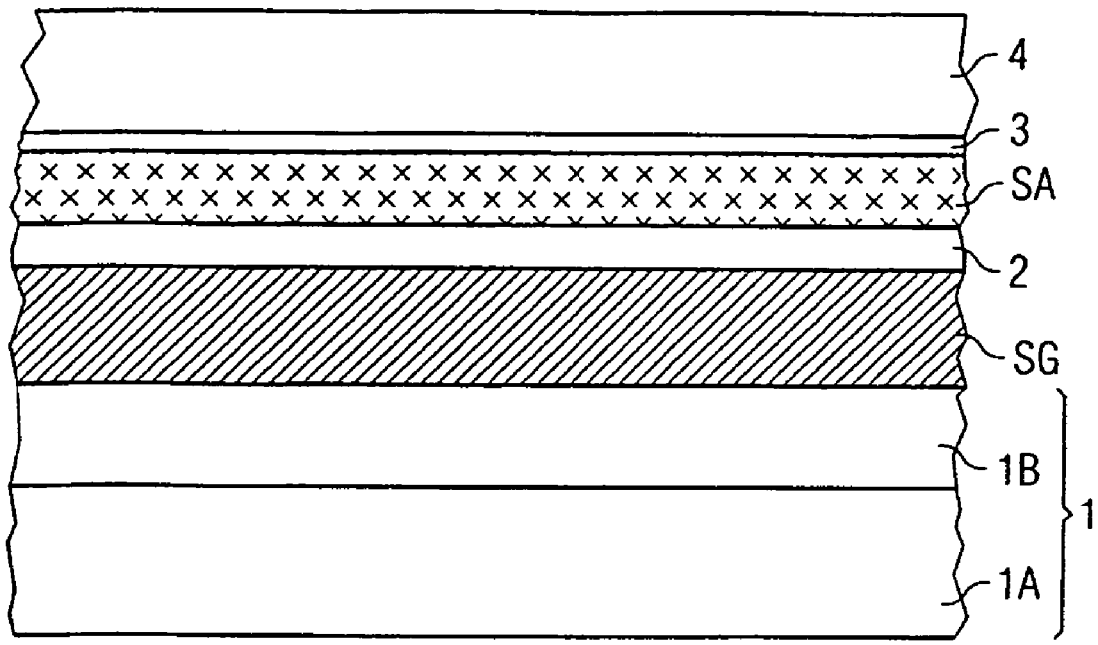
FIGS. 3A and 3B show simplified sectional views illustrating important method steps involved in the fabrication of a semiconductor component according to the invention with stress-absorbing semiconductor layer.

First of all, in accordance with FIG. 3A, a carrier material 1 is provided, which includes, for example, a silicon semiconductor material. Alternatively, however, it is also possible to use any other crystalline and approximately lattice-matched carrier material (e.g. sapphire, etc.).

In particular in order to improve a surface quality, the carrier material 1 may, for example, comprise a semiconductor substrate 1A with a (100) surface orientation, in which case it is preferable to use a Si substrate. To achieve a high-quality starting surface and to bury the interface states at the interface between 1B and 1A, it is possible, in accordance with FIG. 3A, by way of example, for a semiconductor buffer layer 1B to be deposited epitaxially, in which case it is preferable for a silicon buffer layer to be deposited by means of a molecular beam epitaxy (MBE) process or a MOCVD (metal organic chemical vapor deposition) process. Particularly when using an MBE process, this treatment step results in a starting surface which has been smoothed to a range of one atom layer. The thickness of the buffer layer 1B is in this case determined only by a processing rate (throughput) and a predetermined starting quality.

As an alternative to the smoothing process described above, it is also possible to carry out conventional smoothing processes, such as for example CMP (chemical mechanical polishing) processes.

Then, a crystalline stress generator layer SG is formed on the carrier material 1 or the smooth starting surface of the semiconductor buffer layer 1B, the crystal structure of this stress generator layer SG substantially having a first lattice constant for the purpose of generating a mechanical stress in the stress-absorbing semiconductor layer which is subsequently formed.

By way of example, the stress generator layer SG includes a IV-IV semiconductor or a III-V semiconductor. However, it may also include a multilayer sequence and/or change gradually by means of a molecular beam epitaxial, which in turn results in improved ongrowth properties for the subsequent layers. In particular when an Si layer is used as stress-absorbing semiconductor layer SA, it is preferable for $Si_{1-x}Ge_x$ to be used as semiconductor material for the stress generator layer SG, the Ge content usually being set to from 10 to 50% (x=0.1-0.5). This results in a lattice constant in the stress generator layer SG which is slightly different than the carrier material and in particular than the stress-absorbing semiconductor layer SA which is subsequently to be formed, this lattice constant of the stress generator layer deviating, for example, by a few percent (less than 10%) at its (final) atom layer on account of its mismatch.

When realizing a sub-100 nanometer semiconductor component, this stress generator layer SG is formed with a typical thickness of 10 to 300 nanometers, preferably using a MOCVD (metal organic chemical vapor deposition) process. Each crystal layer which is subsequently formed with a significantly lower thickness will accordingly orient its lattice constant relative to this top layer.

While in conventional processes the stress-absorbing layer SA is at this point formed directly on the stress generator layer SG, in the process according to the invention a stress transmission layer 2, which transmits the mechanical stress which has been generated and also has insulating properties, is now formed.

Since thermally formed or deposited insulator layers, such as for example oxide layers, have an amorphous structure, they are not in principle suitable as stress transmission layers. By contrast, crystalline insulator layers with a predetermined crystal structure are able to transmit mechanical stresses of this nature which have been generated in the stress generator layer SG to a following stress-absorbing semiconductor layer SA. Examples of known crystalline insulator layers of this type include $CdF_2$, $CaF_2$ and the like.

When using a stress-absorbing semiconductor layer consisting of silicon, in particular $CaF_2$ has particularly good properties, since the lattice constant of $CaF_2$ is very well matched (for example very similar) to the lattice constant of silicon (lattice constant of $CaF_2$=0.546 nanometer, lattice constant of Si=0.543 nanometer at room temperature). Furthermore, $CaF_2$ constitutes an electrical insulator with the highest energy gap (valence band to conduction band=12 eV) of all existing materials. On account of this extraordinarily large energy gap (12 eV), when using $CaF_2$ it is sufficient to form just a few atom layers at the surface of the stress generator layer SG. Accordingly, it is preferable for an approx. 1 to 2 nanometer thick $CaF_2$ stress transmission layer 2 to be deposited as a buried insulator by means of, for example, an atomic layer deposition process (ALCVD, atomic layer chemical vapor deposition) or an MBE process.

Then, the actual stress-absorbing semiconductor layer SA is formed at the surface of the insulating stress transmission layer 2, with a silicon semiconductor layer preferably being formed as active region, e.g. channel region K, for the semiconductor component. Particularly when producing sub-100 nanometer semiconductor components, in which case field-effect transistors may, for example, have a channel length of 15 nanometers, in this case an intrinsic semiconductor material, i.e. intrinsic silicon, with a thickness d of less than ⅓ of a channel length L is deposited. Accordingly, for a channel length L=15 nanometers, approx. d=5 nanometers of intrinsic semiconductor material are deposited by ALCVD or MOCVD or MBE processes, resulting in a semiconductor component with a fully depleted active region or semiconductor body (fully depleted bodies).

In this case, the insulating stress transmission layer 2 is responsible for ensuring reliable and full depletion of this stressed or stress-absorbing semiconductor layer SA, with the result that in addition to the improved charge carrier mobility all the advantages of a fully depleted semiconductor component are also obtained. Since the stress transmission layer 2 also only includes a few atom layers and, furthermore, in the case of $CaF_2$ and Si is optimally matched in terms of its lattice constant, the mechanical load or stress which is generated in the stress generator layer SG is transmitted virtually without losses to the stress-absorbing semiconductor layer SA.

Then, in accordance with FIG. 3A, a gate dielectric 3 and a control layer 4 are formed at the surface of the stress-absorbing semiconductor layer SA. The gate dielectric 3 may, for example, comprise conventional gate dielectrics, such as for example silicon nitride, silicon dioxide, ONO layer sequences or future new high-k dielectrics, etc., whereas the control layer 4 may in the same way consist of conventional gate materials, such as for example doped polysilicon or metal.

However, it is preferable to use gate dielectrics with a high dielectric constant or what are known as high-k dielectrics as gate dielectric, in which case it is preferable to deposit $HfO_2$, $HfSi_xO_y$, HfSiNO etc. once again by means of an ALCVD or MOCVD process in a thickness of typically 3 nanometers. On account of the dramatic mismatch of the lattice constants of these materials, i.e. of the gate dielectric, and on account of the low deposition temperatures for the stress-absorbing semiconductor layer SA, the deposition process takes place in amorphous form.

With regard to the gate material or control layer 4, what is known as a mid-gap material is deposited as gate material, in particular when full depletion of the active semiconductor body is desired. Materials of this nature may favorably influence interactions with the high-k materials of the gate dielectric 3, in which case, in the case of the hafnium gate materials mentioned above, it is preferable to use a metal gate, such as for example TiN, as control layer 4.

Figure 3B:
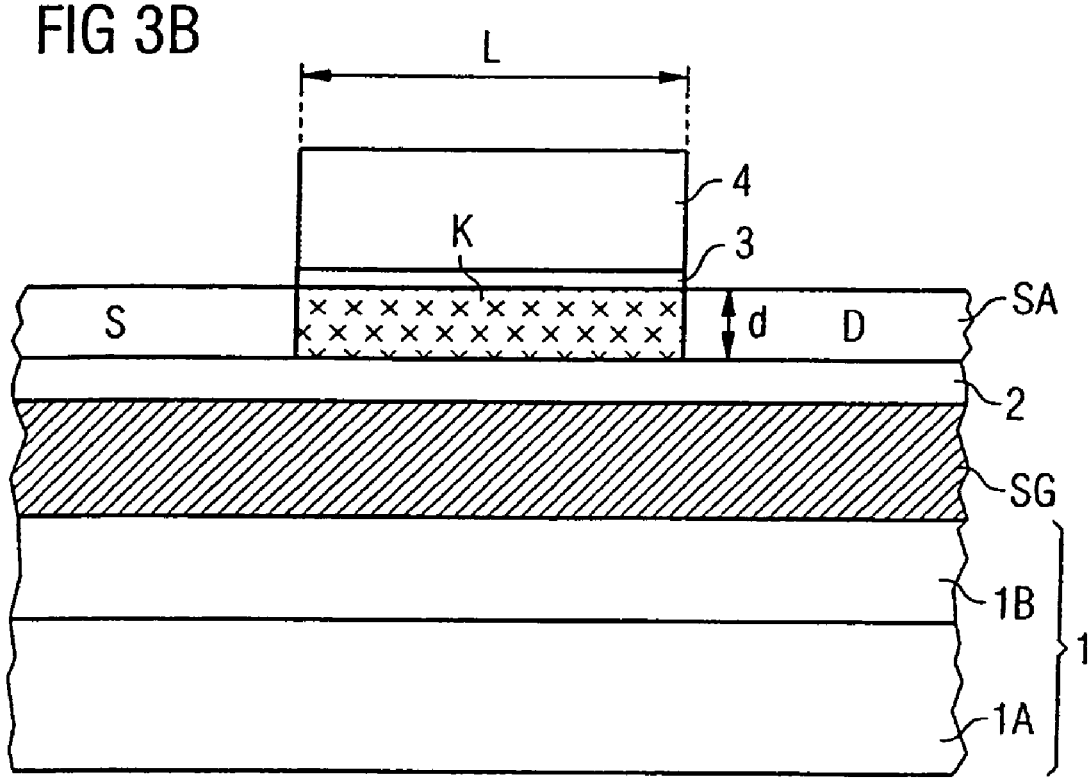

Finally, in accordance with FIG. 3B, both the control layer 4 and the gate dielectric 3 are patterned and source and drain regions S and D are in each case formed in the stress-absorbing semiconductor layer SA in order to complete a field-effect transistor. The further steps involved in forming spacers, contact holes, connection regions, etc. correspond to the prior art, and consequently will not be described below.

In this way, it is possible to fabricate in particular semiconductor components with stressed or stress-absorbing semiconductor layers and/or semiconductor layers operating with full depletion in a simple and inexpensive way, with the result that in particular an off-current is reduced and a charge carrier mobility and therefore clock rate of the semiconductor component are improved.

In the same way, it is possible, in particular when using gate dielectrics with a high dielectric constant, to reduce the equivalent oxide thicknesses (EOT), with the result that the driving can be improved and in particular reduced voltages can be effected.

Furthermore, the insulating stress transmission layer reduces what are known as punch-through effects and in particular is able to reduce an off-state leakage current considerably. In particular, however, a corresponding layer structure is now also available for sub-100 nanometer semiconductor components, allowing semiconductor components with only minor deviations in the electrical properties and with sufficient reproducibility to be produced.

The invention has been described above on the basis of an nMOSFET. However, it is not restricted to this particular application and in the same way also encompasses pMOSFETs or other semiconductor components with a stress-absorbing semiconductor layer. Furthermore, the invention has been described above on the basis of a stress-absorbing semiconductor layer consisting of silicon and a stress transmission layer consisting of $CaF_2$. However, it is in the same way also possible to use alternative materials to produce these layers.

The invention claimed is:

1. A method for fabricating a semiconductor component having a stress-absorbing semiconductor layer, comprising the steps of:
    a) forming a carrier material having a first lattice constant;
    b) forming a crystalline stress generator layer having in its final atom layer substantially a second lattice constant being different from the first lattice constant on the carrier material in order to generate a mechanical stress;
    c) forming an insulating stress transmission layer having a third lattice constant being matched to first lattice constant of the carrier material on the stress generator layer for transmitting the mechanical stress that has been generated;
    d) forming a crystalline, stress-absorbing semiconductor layer having a lattice constant different from the second lattice constant, which is different than the first lattice constant, on the stress transmission layer for the purpose of absorbing the mechanical stress;
    e) forming a gate dielectric on the stress-absorbing semiconductor layer;
    f) forming a control layer on the gate dielectric;
    g) patterning the gate dielectric and the control layer; and
    h) forming source/drain regions in the stress-absorbing semiconductor layer.

2. The method as recited in claim 1, wherein in step a) a semiconductor substrate having a (100) surface orientation is provided, and a semiconductor buffer layer is epitaxially deposited thereon in order to produce a smooth surface.

3. The method as recited in claim 1, wherein in step b) a IV-IV or III-V semiconductor is used.

4. The method as recited in claim 3, wherein in step b) a multiple layer sequence is formed as the stress generator layer.

5. The method as recited in claim 1, wherein in step b) the stress generator layer is smoothed by means of a molecular beam epitaxy process.

6. The method as recited in claim 1, wherein in step c) a crystalline insulator layer is formed as the stress transmission layer.

7. The method as recited in claim 6, wherein in step c) the stress transmission layer with a lattice constant which is matched to the second lattice constant of the stress-absorbing semiconductor layer is formed.

8. The method as recited in claim 7, wherein in step c) only a few atom layers of the stress transmission layer are deposited epitaxially on the stress generator layer.

9. The method as recited in claim 1, wherein in step d) a fully depleted semiconductor material is used.

10. The method as recited in claim 1, wherein in step e) a material with a high dielectric constant is used as the gate dielectric.

11. The method as recited in claim 1, wherein in step f) a metal is used as the control layer.

12. The method as recited in claim 1, wherein
    in step a) Si is used as the carrier material;
    in step b) SiGe is used as the stress generator layer;
    in step c) $CaF_2$ is used as the stress transmission layer;
    in step d) Si is used as the stress-absorbing semiconductor layer;
    in step e) $HfO_2$ is used as the gate dielectric; and
    in step f) TiN is used as the control layer.

13. The method recited in claim 1 further comprising defining a channel between the source/drain regions, the channel having a channel length L, wherein the stress-absorbing region has a thickness d which is less than one-third the channel length L.

14. A method for fabricating a semiconductor component, the method comprising the steps of:
    a) forming a crystalline carrier material having a first lattice constant;
    b) forming a crystalline stress generator layer having in its final atom layer substantially a second lattice constant being different from the first lattice constant on the carrier material in order to generate a mechanical stress;

c) forming an insulating stress transmission layer having a third lattice constant being matched to the first lattice constant of the carrier material on the stress generator layer for transmitting the mechanical stress that has been generated, the stress transmission layer having a stress transmission lattice constant; and d) forming a crystalline, stress-absorbing semiconductor layer on the stress transmission layer for the purpose of absorbing the mechanical stress transmitted by the stress transmission layer, the stress-absorbing semiconductor layer having a lattice constant different from the second lattice constant, which is different from the first lattice constant and which substantially matches the third lattice constant of the stress transmission layer for transmitting stress from the stress transmission layer to the stress-absorbing layer.

15. The method recited in claim 14 further comprising e) forming a gate dielectric on the stress-absorbing semiconductor layer;

f) forming a control layer on the gate dielectric;

g) patterning the gate dielectric and the control layer; and h) forming source/drain regions in the stress-absorbing semiconductor layer.

16. The method recited in claim 15 further comprising defining a channel between the source/drain regions, the channel having a channel length L, wherein the stress-absorbing region has a thickness d which is less than one-third the channel length L.

17. The method as recited in claim 14, wherein in step a) Si is used as the carrier material;

in step b) SiGe is used as the stress generator layer;

in step c) $CaF_2$ is used as the stress transmission layer; and in step d) Si is used as the stress-absorbing semiconductor layer.

18. A method for fabricating a semiconductor component, the method comprising the steps of:

a) forming a crystalline carrier material having a carrier lattice constant;

b) forming a stress generator layer on the crystalline carrier material, the stress generator layer selected to have in its final atom layer a first lattice constant which is different from the carrier lattice constant to generate mechanical stress;

c) forming an insulating crystalline stress transmission layer on the stress generator layer, the insulating crystalline stress transmission layer selected to have a transmission layer lattice constant which is matched to the first lattice constant of the stress generator layer to enhance transmission of the mechanical stress generated in the stress generator layer to a following layer; and d) forming a stress absorbing layer on the stress transmission layer, the stress absorbing layer having a second lattice constant, which is different than the first lattice constant, which is different than the carrier lattice constant, the second lattice constant selected to enhance transmission of the mechanical stress from the stress transmission layer to the stress absorbing layer to improve charge carrier mobility in the stress absorbing layer and to improve selected electrical properties of the semiconductor component.

19. The method of claim 18 further comprising:

defining an active region in the stress absorbing layer, the active region having a thickness d; and forming a field effect transistor as the semiconductor component in the active region, the field effect transistor having a channel length L such that the thickness d is less than one-third the channel length L.

20. The method recited in claim 19 wherein forming a field effect transistor comprises:

e) forming a gate dielectric on the stress-absorbing semiconductor layer;

f) forming a control layer on the gate dielectric;

g) patterning the gate dielectric and the control layer to define the channel length L; and h) forming source/drain regions in the stress-absorbing semiconductor layer.

* * * * *